United States Patent [19]

Partlo

[11] Patent Number: 5,601,733

[45] Date of Patent: *Feb. 11, 1997

[54] FULL FIELD MASK ILLUMINATION ENHANCEMENT METHODS AND APPARATUS

[75] Inventor: William N. Partlo, San Diego, Calif.

[73] Assignee: Cymer, Inc., San Diego, Calif.

[*] Notice: The terminal 18 months of this patent has been disclaimed.

[21] Appl. No.: 316,541

[22] Filed: Sep. 30, 1994

Related U.S. Application Data

[63] Continuation-in-part of Ser. No. 129,414, Sep. 30, 1993, abandoned.

[51] Int. Cl.$^6$ ................................................. B23K 26/06
[52] U.S. Cl. ........................ 219/121.7; 219/121.73; 219/121.74; 219/121.75; 219/121.77; 264/400
[58] Field of Search ................... 219/121.67, 121.68, 219/121.69, 121.7, 121.71, 121.72, 121.73, 121.74, 121.75, 121.77; 264/400, 482

[56] References Cited

U.S. PATENT DOCUMENTS

| | | | |
|---|---|---|---|
| 3,773,404 | 11/1973 | Moore | 219/121.75 |
| 3,972,599 | 8/1976 | Engel et al. | 219/121.74 |
| 4,128,752 | 12/1978 | Gravel | 219/121.68 |
| 4,156,124 | 5/1979 | Macken et al. | 219/121.68 |
| 4,915,981 | 4/1990 | Traskos et al. | 219/121.7 |
| 5,223,693 | 6/1993 | Zumoto et al. | 219/121.68 |
| 5,296,673 | 3/1994 | Smith | 219/121.68 |
| 5,414,239 | 5/1995 | Terabayashi et al. | 219/121.73 |
| 5,473,408 | 12/1995 | Hoffman et al. | 355/53 |

FOREIGN PATENT DOCUMENTS

| | | | |
|---|---|---|---|
| 0488033 | 6/1992 | European Pat. Off. | 219/121.73 |
| 63-192584 | 8/1988 | Japan | 219/121.73 |
| 2-175090 | 7/1990 | Japan | 219/121.73 |
| 88/00108 | 1/1988 | WIPO | 219/121.74 |
| 89/05208 | 6/1989 | WIPO | 219/121.73 |

OTHER PUBLICATIONS

Dyer, P. E., "Unstable Resonators," *The Physics and Technology of Laser Resonators,* Edited by D. R. Hall and P. E. Jackson, Department of Physics, Heriot–Watt University, Edinburgh, Pub. Adam Hilger, Bristol and New York pp. 21–39.

"Development of Transcriber Optics for Eximer Laser Processing," by Tanaka, et al., Mitsubishi Electronics, from The 27th Laser Heat Processing Research Association.

"Development of Eximer Laser Processing Equipment for Volume Production," by Tanaka, et al., Mitsubishi Electronics, from The 27th Laser Heat Processing Research Association.

*Primary Examiner*—Teresa J. Walberg
*Assistant Examiner*—Gregory L. Mills
*Attorney, Agent, or Firm*—Blakely, Sokoloff, Taylor & Zafman

[57] ABSTRACT

Full field mask illumination enhancement methods and apparatus for high power laser systems for ablation utilizing a mask to define the pattern of the material to be removed by ablation wherein the percentage transmissive area of the mask is small. The laser emission is focused to a point or small area to pass through a small hole in an end plate in a light pipe wherein the internal surface of the light pipe and end plate are both highly reflective. The exit end of the light pipe is imaged onto a telecentric lens adjacent the mask or reticle, which mask or reticle is highly reflective except where defining areas for ablation. Laser emission passing through the reticle is imaged onto a work piece, while light reflected by the reticle substantially retraces either its own ray path or that of another ray impinging on the same area of the reticle. Intentional detuning of the system results in the light reflected back into the light pipe generally missing the small hole therein, most of it being repeatedly re-reflected by the light pipe and end plate back to the reticle to reuse the same by repeatedly bathing the reticle in the laser emission until passing through transmissive portions of the reticle, dissipating by losses on each reflection or ultimately finding the hole and passing back to the laser emission source. Various characteristics, capabilities and embodiments of the invention are disclosed.

27 Claims, 11 Drawing Sheets

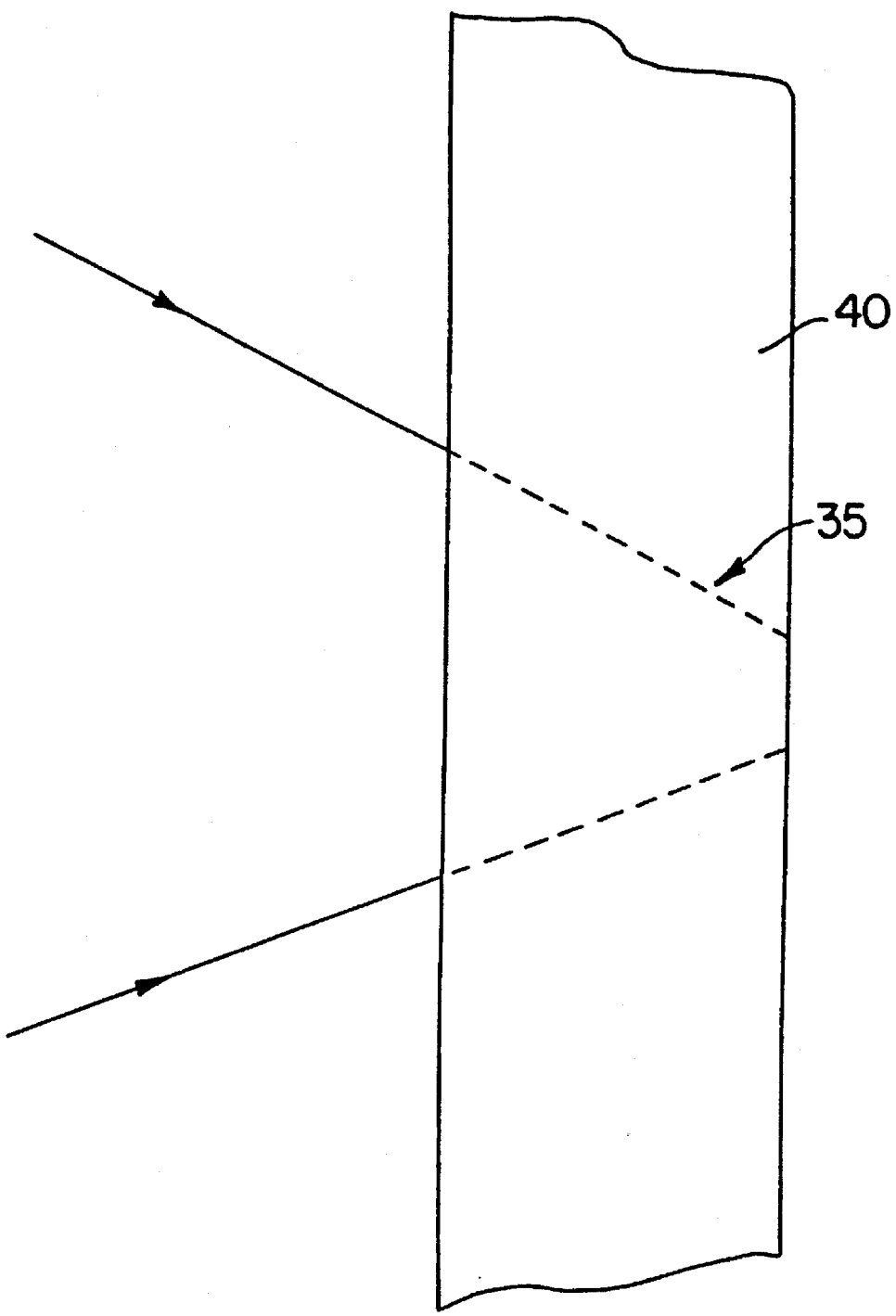
FIG. IA

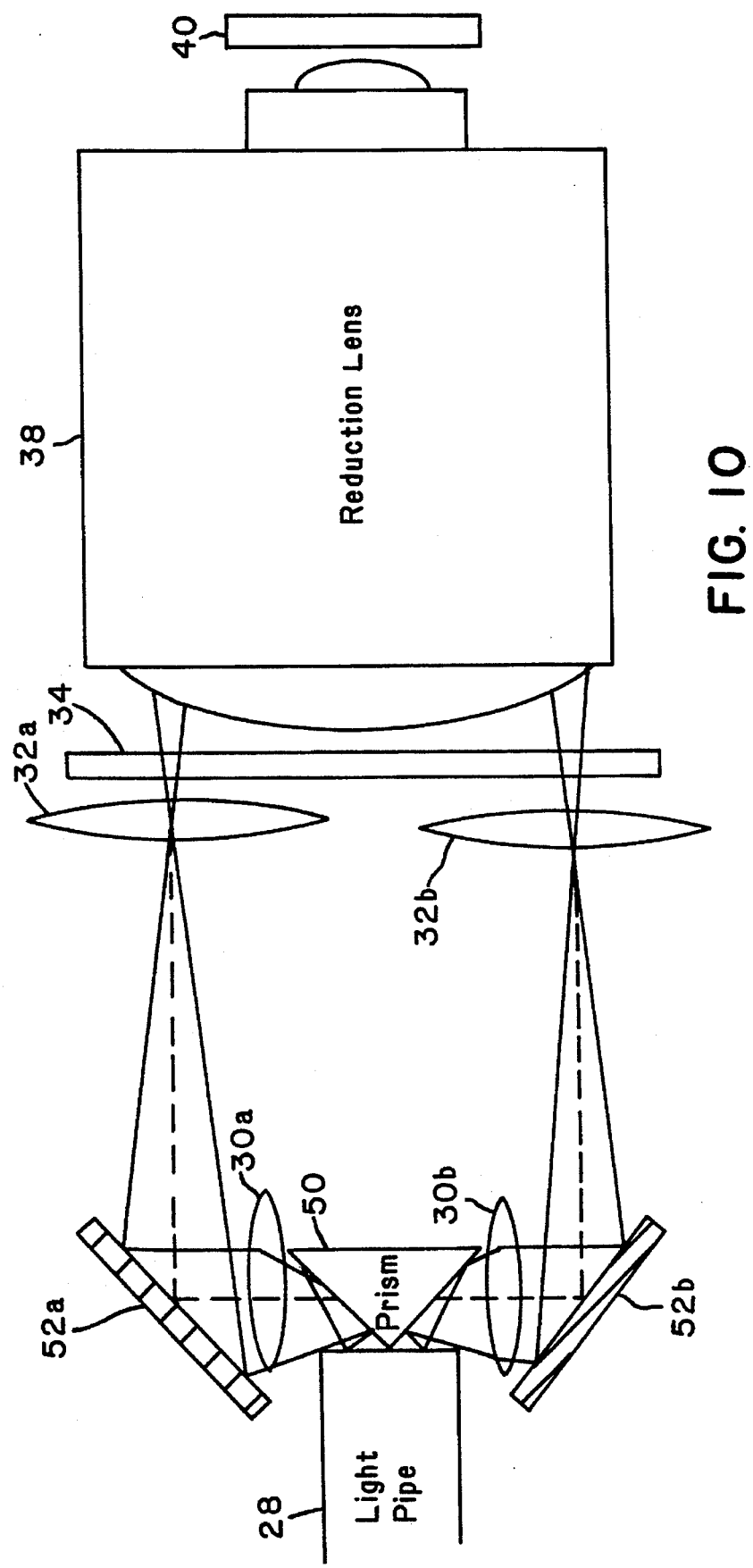

FULL FIELD MASK ILLUMINATION ENHANCEMENT METHODS AND APPARATUS

This application is a continuation in part of application Ser. No. 08/129,414, filed Sep. 30, 1993 and entitled "Full Field Mask Illumination Enhancement Methods and Apparatus," now abandoned.

BACKGROUND OF THE INVENTION

1. Field of the Invention

The present invention relates to the field of high power laser systems for photo exposure and ablation, and more particularly to such systems utilizing a mask to define the pattern of the material to be exposed or removed by ablation.

2. Prior Art

The high power laser market has several applications for illumination systems which make use of the energy reflected from low duty cycle reticles (dark field masks). In the case of hole drilling with ultraviolet (UV) ablation, the holes patterned on a reticle are usually spaced far apart relative to their diameter, thereby defining only a very small percentage of the total area of the reticule. This type of reticle pattern "wastes" nearly all of the incident illumination energy because the energy reflected by the reticle is not captured and redirected through the openings in the reticle. Consequently, a relatively high power laser is normally needed to bath the entire reticule area in energy of sufficient intensity per unit area to remove the material in question at an adequate rate, yet the amount of energy actually productively used in material removal is no more than could be easily provided by a much lower power laser.

Mitsubishi Electric has disclosed a system concept which addresses the foregoing energy waste or loss (see Development of a High Efficiency Illuminator for Eximer Laser Machining, Masaaki Tanaka, et al., presented at Laser Thermal Machining Workshop, January, 1992). In that system, a flat plate reflector is placed in front of and parallel to the reticle. The laser provides a beam of the width of the reticle, but of only a small fraction of the height of the reticle. The parallel combination of the reticle and reflector are tilted forward slightly from being perpendicular to the optical axis of the laser, and the top of the reflector is positioned low enough to enable the laser beam to project just over the back of the reflector onto the upper part of the reticle. Assuming the reticle is mostly reflective, the beam will reflect from the reticle slightly downward to the reflector, reflecting therefrom back and forth in a downward continuous "Z" pattern between the reflector and reticle, illuminating the holes in the reticle where applicable, diminishing in intensity because of energy loss through the holes in the reticle, because of losses on each reflection and because of beam divergence. For a given reticle of a low percentage hole area, it is stated that this provides an energy utilization gain of 12 times over the conventional direct illumination systems.

The foregoing system concept has the advantage of being able to use lower power lasers and lasers operating at less than their maximum output to potentially obtain the same or higher material removal rates than normally obtainable with higher power lasers operating at or near their limits. However the achievement is not without its limitations and compromises. Because the beam from the laser is wide and thin, beam conditioning would be a problem, giving rise to non uniformities in the beam intensity in the horizontal direction. Also the distribution of energy in the vertical direction may be non uniform because of the inability to perfectly "stack" the rectangular re-reflections down the reticle. Because the system requires off-axis incidence in the initial beam and all re-reflections, one does not have a convenient way to form conical holes in the work piece of an arbitrary taper. In that regard, applications for such systems such as the manufacture of heads for ink jet printers may require not only small holes, but small holes with a predetermined conical shape. Finally, such a system would be very sensitive to the accuracy of the setup, including but not limited to the spacing and parallel alignment between the reticle and the mirror.

The following disclosure describes a simple illumination system which provides substantially uniform intensity illumination over an area or areas while increasing the usable intensity of a laser source by reusing much of the energy reflected from the reticle without special sensitivity to alignment of the parts of the system and without compromising the ability to produce tapered holes to specification.

The disclosure also describes a method and apparatus for controlling the time-intensity profile of the emission, for large area panel illumination and other aspects of the invention.

BRIEF SUMMARY OF THE INVENTION

Full field mask illumination enhancement methods and apparatus for high power laser systems for photo exposure and ablation utilizing a mask to define the pattern of the material to be exposed or removed by ablation wherein the percentage transmissive area of the mask is small. The laser emission is focused to a point or small area to pass through a small hole in an end plate in a light pipe wherein the internal surface of the light pipe and end plate are both highly reflective. The exit end of the light pipe is imaged onto a telecentric lens adjacent the mask or reticle, which mask or reticle is highly reflective except where defining areas for ablation. Laser emission passing through the reticle is imaged onto a work piece, while light reflected by the reticle substantially retraces either its own ray path or that of another ray impinging on the same area of the reticle. Intentional detuning and/or imperfections in the system result in the light reflected back into the light pipe generally missing the small hole therein, most of it being repeatedly re-reflected by the light pipe and end plate back to the reticle to reuse the same by repeatedly bathing the reticle in the laser emission until passing through transmissive portions of the reticle, dissipating by losses on each reflection or ultimately finding the hole and passing back to the laser emission source. The length of the illuminator determines the time-intensity profile of the emission, with a short illuminator exhibiting a short, high intensity illumination. Various characteristics, capabilities and embodiments of the invention are disclosed.

BRIEF DESCRIPTION OF THE DRAWINGS

FIG. 1A illustrates the workpiece 40 with a tapered via 35.

FIG. 10 illustrates a modification of the system of FIG. 1 to obtain a split field illumination enhancement.

DETAILED DESCRIPTION OF THE INVENTION

Figure 1:
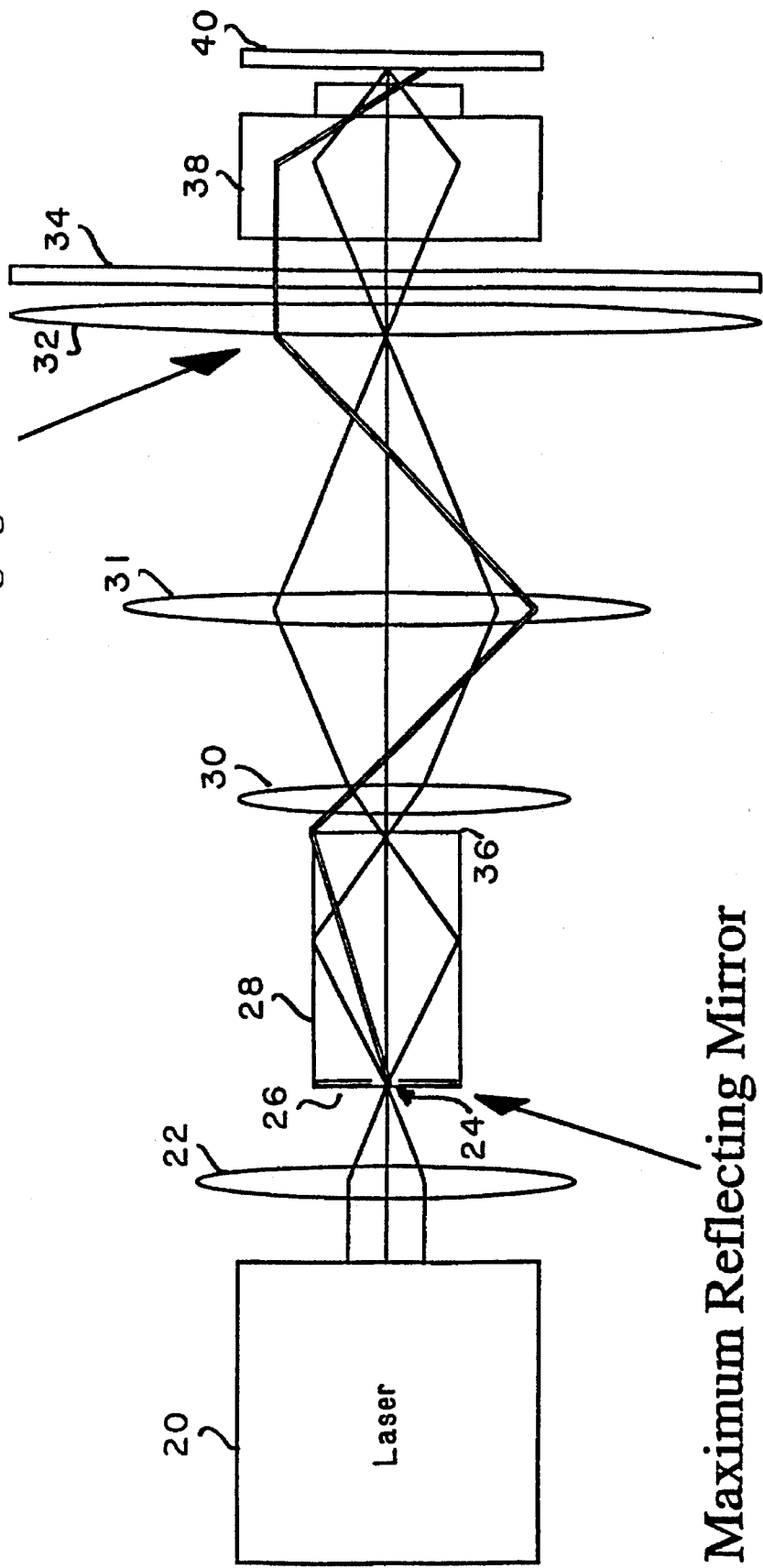
FIG. 1 is a block diagram illustrating the present invention.

First referring to FIG. 1, a schematic diagram of the energy intensifying illumination system of a preferred embodiment of the present invention may be seen. This system differs from other illumination systems which make use of light pipes as a uniformizing component in two important ways. The first and most important difference is the reflective component placed at the entrance to the light pipe. This component has a small hole at its center and a normal incidence $R_{max}$ (highly reflective) coating on the side facing the light pipe. The second special attribute of this illuminator system is the telecentric imaging at the reticle plane which is needed to capture the rays reflected from the reticle and reimage them back into the light pipe.

The system operates as follows. The substantially collimated emission from the laser 20 is focused by lens 22 to a point or small area to pass through the hole 24 preferably at the center of the reflective member 26 at the entrance to the light pipe 28. Lenses 30 and 31 image the exit end of the light pipe 28 onto field lens 32 which in turn directs the light to the reticle 34.

The light in the center portion of the cone of light entering the light pipe 28 will pass through the light pipe without striking the inner reflective walls of the light pipe (see rays 36 in FIG. 1 defining the outer bounds of the center portion of the cone). As to these rays, referred to herein as the principal rays, the field lens 32 is purposely made telecentric, so that all such rays passing through the field lens will be parallel to each other and perpendicular to the reticle. They will therefore either pass through holes in the reticle (representing a very small percentage of the area of the reticle) or be reflected by the reticle back in the same direction they came from. In essence, as to these reflected rays, the system is substantially retroreflective, returning the rays along their original path.

Figure 3:
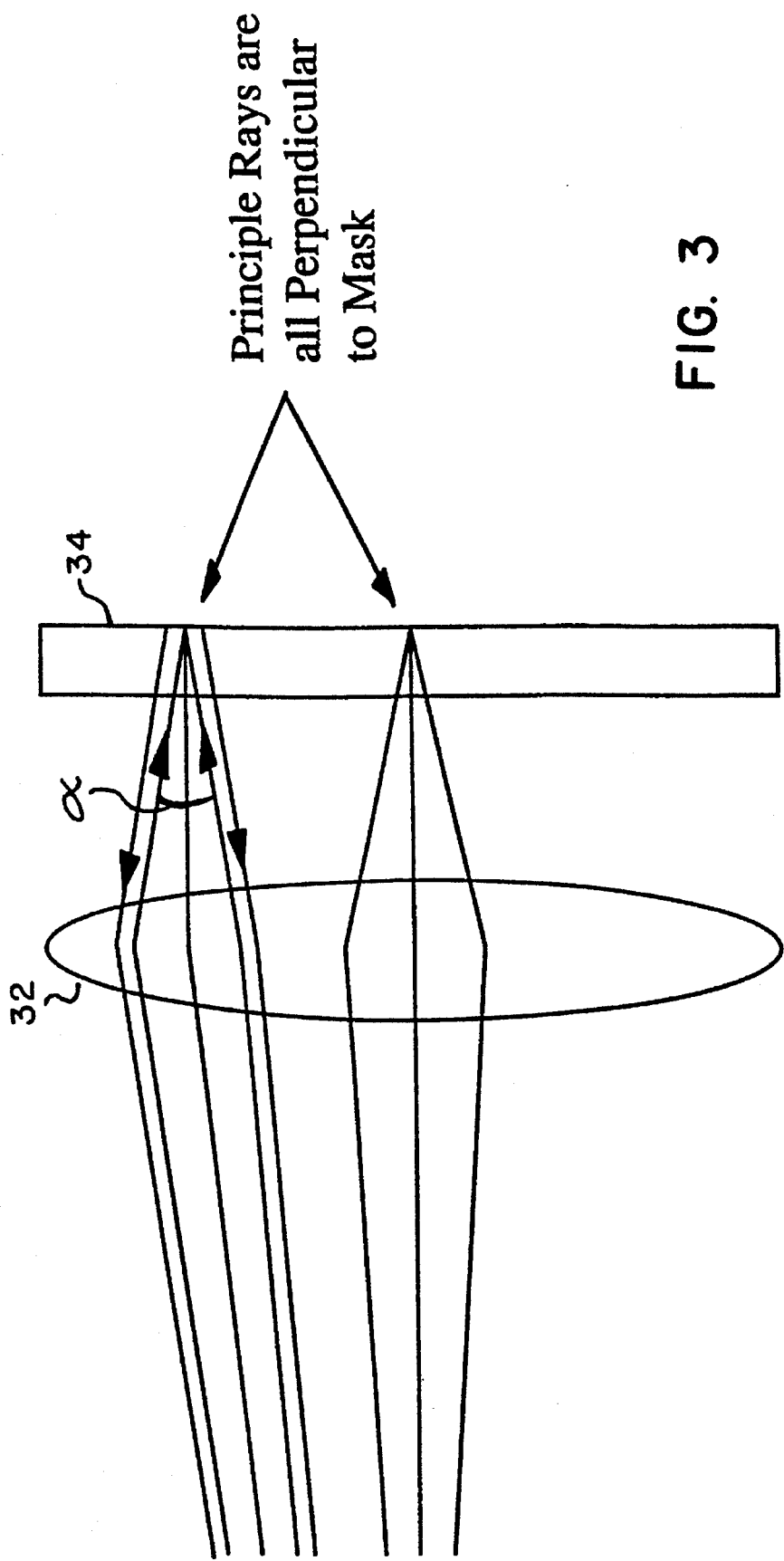
FIG. 3 is a diagram illustrating the optical characteristics of the telecentric lens adjacent the reticle in an operating system in accordance with the present invention.

As to the rays entering the light pipe 28 at greater angles to the optical axis, these rays will bounce off the walls of the light pipe one or more times before exiting the light pipe. Since the lens 30 images the end of the light pipe onto the field lens 32, these rays too will impinge on the same area of the field lens as the center rays herein before described. However they will be incident to the field lens at angles such that they do not emerge from the field lens parallel to the optical axis as before, but instead, for each and every spot on the reticle, are distributed in a cone about the principal ray perpendicular to the reticle at the same spot (which is parallel to the optical axis as previously described). The cone angle α, illustrated in FIG. 3 and equal in all directions if axi-symmetric lenses are used, is determined by and can be changed by changing various parameters of the optical system. As to these rays, inclined with respect to the principal rays, the system is not retroreflective. Note however, that each such ray inclined with respect to the principal ray (axis of the cone) has a conjugate within the cone, so that when reflected by the reticle, each ray substantially retraces the path of its conjugate, again staying within the optical system for reuse. The cone angle is determined by the length and aspect ratio of the light pipe in combination with the focal length of the input lens (22 of FIG. 1) control the illumination cone, and through selection of these parameters may be controlled as desired. The conical beam passing through the mask or reticle 34 results in a tapered via 35 when imaged on the workpiece 40 as shown in FIG. 1A.

If the imaging system is perfect, the recaptured rays will all be imaged back through the exit end of the light pipe and then through the hole in member 26 at the entrance of the light pipe, back to the laser. However by design, the imaging optics can be made slightly imperfect (including but not necessarily limited to slight axial misalignment of components) so that the rays reflected from the reticle will not be reimaged back through the hole at the light pipe entrance. The rays which miss the small entrance hole will be reflected by the $R_{max}$ coating placed on the inside surface of the entrance plate 26. The rays reflected from the entrance plate will traverse the light pipe 28 again and will again be imaged onto the reticle, this time at slightly different positions. The process repeats until the light either passes through openings in the reticle, passes through the light pipe entrance hole, or is absorbed by the optics in the illumination system.

The system shown in FIG. 1 assumes a 3× magnification from the light pipe to the reticle. The illuminated area of the reticle 34 assumes a 5× reduction in the imaging system 38 and an image field size of 15×15 mm on work piece 40, giving a 75×75 mm reticle area. The NA of the imaging system is assumed to be 0.07, representative of a prior art system. This imaging NA combined with the reduction value and an assumed partial coherence of 0.7 give an illumination NA of only 0.0098. The 3× imaging from the light pipe 28 to the reticle 34 makes the NA at the light pipe equal to 0.029.

Figure 2:
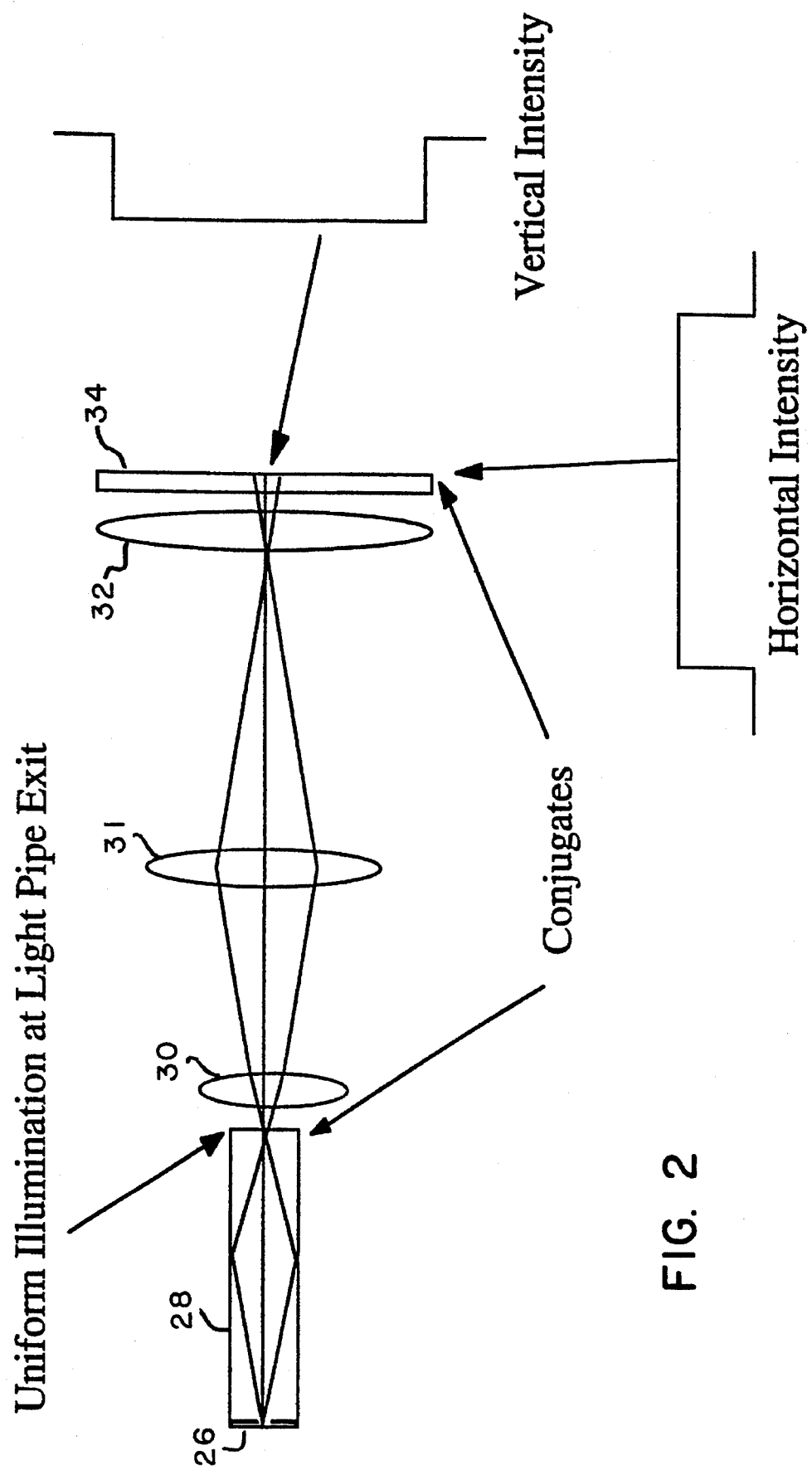
FIG. 2 is a diagram illustrating the uniformity of intensity of illumination of the mask along both of the orthogonal axes.

The length of the light pipe is determined by its transverse dimensions and the cone of rays which pass through the light pipe. Since the magnification from the light pipe 28 to the reticle 34 is 3× and the reticle dimensions are 75 ×75 mm, the light pipe's transverse dimensions are 25×25 mm. The length of the light pipe is determined by its width, 25 mm, and the need for one bounce at an NA of 0.029. The light pipe length is given by:

$$L = \frac{W}{\theta}$$

where θ is the NA inside the light pipe, W is the light pipe width, and L is the light pipe length. The required length for this example is 862 mm. Also the use of at least one bounce for some of the rays in the light pipe provides a uniformizing effect so that the intensity of illumination across the mask face is substantially uniform, as illustrated in FIG. 2.

The size of the hole in the light pipe entrance plate should be as small as practical. The magnitude of the intensification of the illuminator depends strongly on the size of this hole relative to the transverse area of the light pipe. Assuming that the system is not in an artificial environment, the minimum size of the hole is limited by air breakdown caused by high UV intensity. A maximum allowable intensity is believed to be approximately 16 J/cm$^2$, so that operating five times below that value, or 3.2 J/cm$^2$, should be quite conservative. A particular laser manufactured by Cymer Laser Technologies, assignee of the present invention, as its model HPL-100K produces 0.5 J per pulse, and thus the minimum hole area for this laser is 0.16 cm$^2$ or 4.4 mm diameter. This area is approximately 2.5% of the light pipe transverse area.

Note that the hole size has been designed using the full input energy of the exemplary laser. The purpose of this illumination system is to reduce the required input pulse energy. The entrance hole size can be much smaller than the above value because the required input energy will be 5–10 times lower than what the current exemplary laser produces, though for purposes of illustration the hole size determined above will be used as a conservative value.

The multiplication factor of this illumination system depends on three factors; the duty cycle of the reticle, the single pass loss of the light pipe and illuminator optics, and the ratio of the entrance hole area relative to the light pipe's transverse area. These three factors can be combined into one factor, $R_{total}$, which represents the round trip loss from the light pipe entrance, to the reticle, and back again. This "photon recycling" process will repeat, creating a geometric series. The multiplication factor, M, is thus given by:

$$M = \frac{1}{1 - R_{total}}$$

The value of $R_{total}$ is given by:

$$R_{total} = R_{dc} * T^2_{loss} * R_{area}$$

where $R_{dc}$ is the duty cycle loss at the reticle, $T_{loss}$ is the single pass transmission loss of the optics, and $R_{area}$ is the loss due to leakage back out the entrance hole.

The duty cycle loss can be very small. The Mitsubishi paper, referred to in the background section herein and describing an alternate technology, quotes a duty cycle of 0.04%. This duty cycle gives a $R_{dc}$=0.9996. The single pass transmission, $T_{loss}$, is dominated by the reflectivity of the light pipe and the losses due to imperfect AR (anti-reflective) coatings on the lenses. The reflective material used in the light pipe would most likely be UV aluminum because dielectric mirrors exhibit poor performance at the oblique angles which exist inside the light pipe. The normal incident reflectivity of UV aluminum mirrors from Newport, for example, are specified to be 95% at 248 nm. This reflectivity will be higher for the incident angles used in the light pipe (88°–89° from normal). Assume a 98% value as a conservative estimate. Also assume that the AR-coatings on the lenses each have a 0.5% loss. Since there may be 3 lenses (some configurations may use an additional lens right at the exit of the light pipe) and one AR-coated reticle surface, there are 7 AR-coatings for a total loss of 3.5%. The mirror losses and lens losses combine to produce a single pass transmission of $T_{loss}$=0.946. The third loss mechanism, $R_{area}$, is one minus the ratio of the entrance hole area to the light pipe transverse area. As stated above, the entrance hole is 2.5% of the light pipe transverse area, giving $R_{area}$=0.975.

The above values combine for an $R_{total}$ of 0.872. This value for $R_{total}$ gives a multiplication factor of 7.8. The amount of energy multiplication is strongly dependent on each of these loss factors. The greatest loss factor is the single pass transmission since the square of this value is used in the formulation of $R_{total}$. Improving the single pass transmission to 0.97 by improving the AR coatings, for example, increases the multiplication factor to 12.0.

To calculate the energy densities incident on various parts of this illuminator, assume an energy density of 300 mj/cm$^2$ at the image plane (work piece). The 5× imaging lens should have nearly 100% transmission and thus the intensity at the reticle plane will be 25 times less than the image plane, or 12 mj/cm$^2$. (This 12 mj/cm$^2$ value is the multiplied value, due to the intensity enhancement of the illuminator.) The intensity at the exit of the light pipe will be 9 times that of the reticle due to the 3× magnification, or 108 mj/cm$^2$. The intensity on the $R_{max}$ mirror at the light pipe entrance will be approximately the same as the intensity at the exit of the light pipe, or 108 mj/cm$^2$. This dielectric mirror preferably should have a damage threshold in the range of 200 mj/cm$^2$.

An additional critical damage threshold is the light pipe's aluminum mirrors. Fortunately, the UV energy is incident on a large area of aluminum due to the cosine effect. Approximately one half of the energy will be reflected off of the four sides of the light pipe and only half of the length of the light pipe is illuminated. For this situation, the energy is spread over an area of 431 cm$^2$, giving a energy density of 1.56 mj/cm$^2$. The damage threshold specified by Newport for UV aluminum mirrors is 10 mj/cm$^2$, so this is well below safe levels.

To otherwise achieve the 300 mj/cm$^2$ desired across the 15×15 mm image plane, one would need a 675 mj/pulse laser without any multiplication effect. With the multiplication factor of this embodiment of the present invention of 7.8 derived above, this image intensity can be achieved with a 87 mj/pulse laser.

One preliminary optical design which achieves the goals of the previous sections uses three lenses with f numbers of 17, 8.2, and 7.2. None of these lenses are difficult to fabricate and the thickest element is 10 mm at its vertex. The image blur for a point source placed at the light pipe entrance hole is 2 mm diameter after reflecting off of the reticle and being reimaged onto the light pipe entrance plate. The imaging of this system is actually too good and a slight "detuning" of the optics would preferably be used to produce the desired large image blur at the entrance plate.

The point of this invention is that substantially all of the rays reflected from the reticle can be recaptured and returned to their starting points. There will be very little energy loss due to rays refracting outside lens apertures or outside the light pipe.

As an alternative to the foregoing system, the limitation of the energy density in the hole in the end plate at the entrance end of the light pipe may be eliminated by operating at least that portion of the optical path in a vacuum. This will allow the use of a smaller hole in the end plate 26, limited by system mechanical alignment, stability and focusing capability. This in turn will allow even less of the emission reflected back into the light pipe to pass through the hole in the end plate back to the laser source, less system detuning or both. To achieve this, the vacuum enclosure would need to include the end plate 26 and probably the light pipe 28, but could include other components also as desired. By way of example, lenses 22 and 30 might form the windows of a vacuum enclosure, or alternatively lenses 22 and 32. Separate flat plate vacuum enclosure windows could be used, though preferably the number of potentially reflective surfaces particularly between the reticle and the light pipe should be minimized. Also the allowable energy intensity would be expected to go up as pressure goes down, so that a hard vacuum should not be required to achieve a substantial gain in allowable energy intensity. Consequently a true hermetic (fused) seal on the windows may not be required in many such applications.

Figure 4:
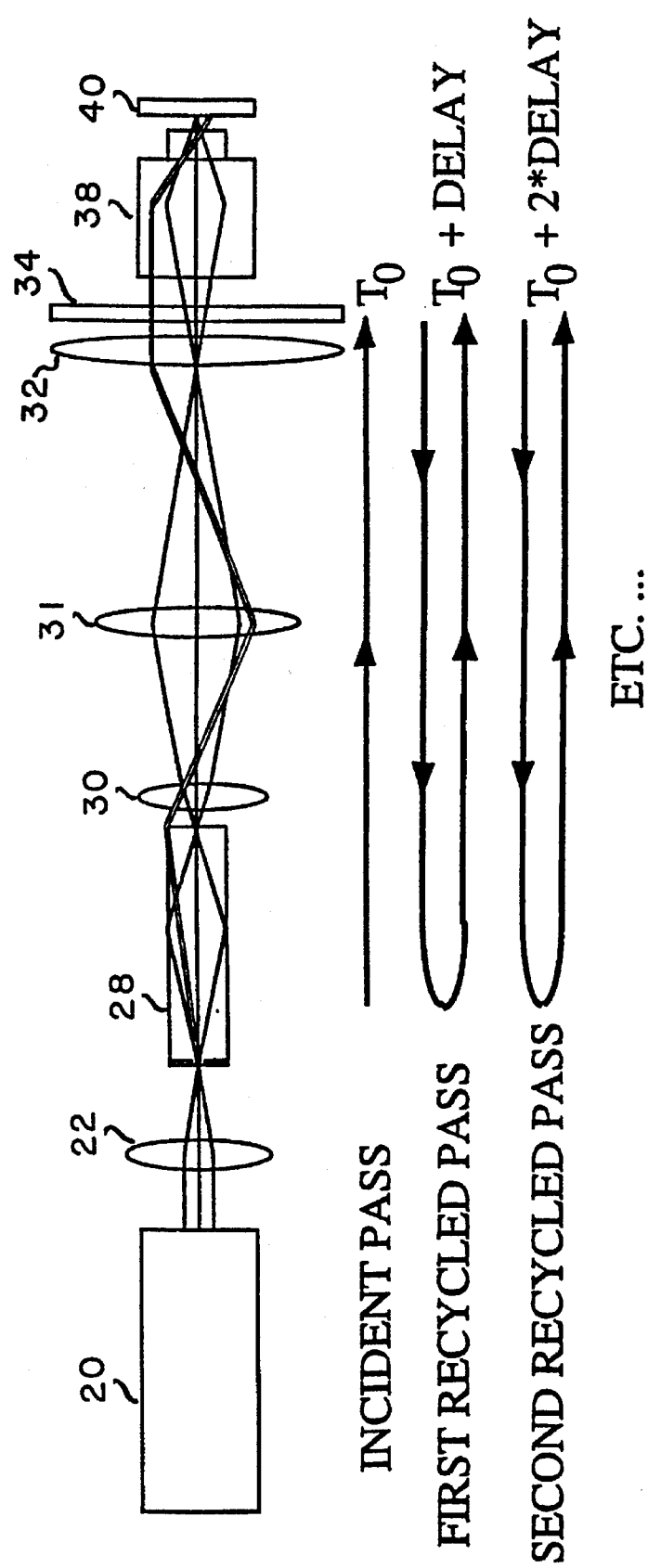
FIG. 4 illustrates the transit time $T_o$ of the laser emission through the optical system before reaching the mask, and for the rereflections of the substantial portion of the emission impinging on the reflective portions of the mask.

Now referring to FIG. 4, another aspect of the present invention may be seen. As shown therein, the initial emission of the laser will have a transit time $T_o$ through the optical system before reaching the mask, and for that portion of the emission falling on transmissive portions of the mask, reaching the workpiece 40. For that substantial portion of the emission impinging on the reflective portions of the mask, reflected back to the light pipe and then back to the mask, this first recycled emission will reach the mask some delay time period after the initial emission reached the mask. This delay time period is equal to the transit time from the reflective surface of the mask 34 to the reflective inner surface of the entrance end of the light pipe and again back to the mask. Again, as to the portion of the first recycled emission which does not fall on a transmissive area of the mask, the same will be recycled a second time, falling on the mask with an equal delay with respect to the first recycled emission, or two delay time periods from the initial emission. This of course will continue, though with some losses on each recycling.

Figure 5:
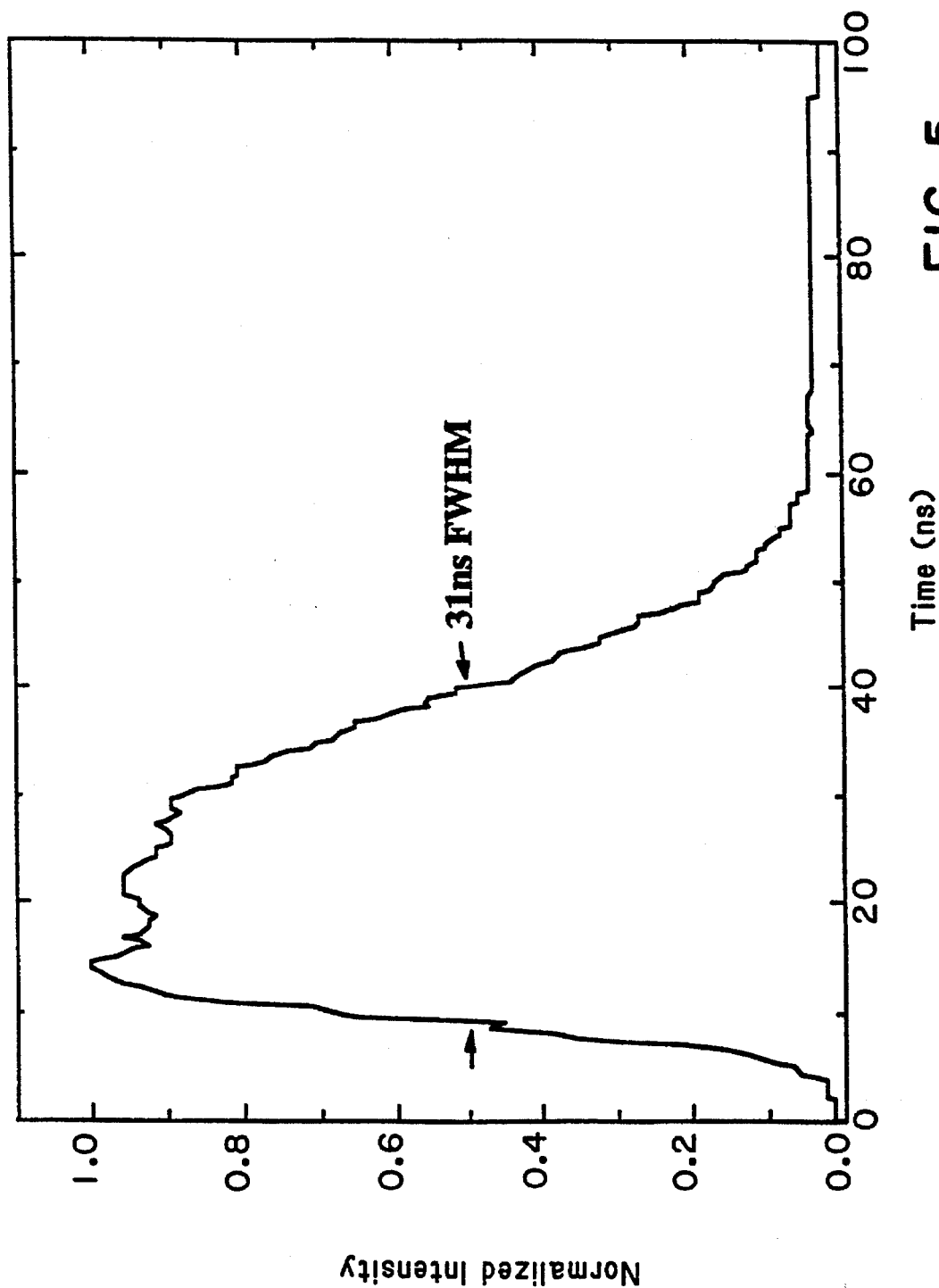
FIG. 5 presents a plot of the normalized intensity versus time, in nanoseconds (ns), of the pulse emission of a typical laser of the type that may be used with the present invention.
Figure 6:
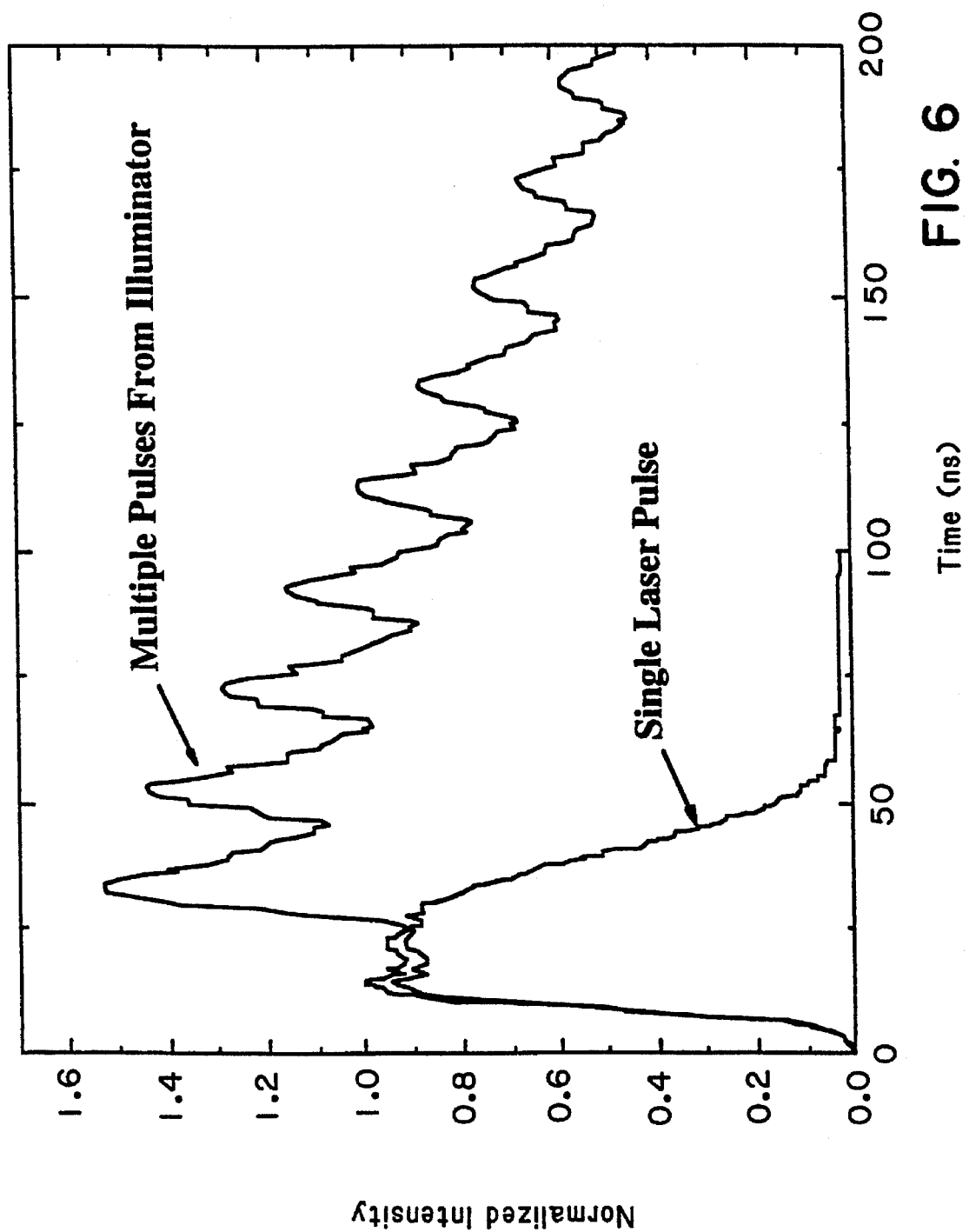
FIG. 6 illustrates the emission pulse duration produced by a long illuminator in accordance with the present invention.

The significance of the foregoing may be illustrated with respect to FIG. 5. This Figure presents a plot of the normalized intensity versus time, in nanoseconds (ns), of the pulse emission of a typical laser manufactured by Cymer Laser Technologies, assignee of the present invention. As may be seen from the Figure, the peak intensity of the emission is reached in approximately 12 ns, remaining quite high for approximately another 18 ns and then falling off to approximately 5% of the peak in another 30 ns. Since the speed of the emission (speed of light C) is approximately 1 foot per ns, and the transit distance back and forth on each reflection is twice the length of the relevant portion of the optical system, the delay time period illustrated in FIG. 4 will be approximately 2 ns for each foot of the relevant portion of the optical system. For a relatively long optical system, namely an illuminator of approximately 10 feet, the time delay of FIG. 4 will be approximately 20 ns. Thus, before the initial incident illumination has substantially fallen off, the initial rise thereof reflected by the mask will have been re-reflected by the reflective end of the light pipe and the again be incident on the mask. This is illustrated in FIG. 6, wherein the single laser pulse of FIG. 5 is reproduced and summed with replications thereof, each delayed approximately 20 ns from the prior pulse and diminished somewhat in amplitude as a result of reflection losses on each double traverse of the relevant portion on the optical path. It can be seen from FIG. 6 that while the peak normalized intensity is increased by over 50% by the re-reflections, the time length of the emission is expanded much more. Of course, overall, the total energy in the emission incident on the mask and on the work piece has been greatly expanded.

Figure 7:
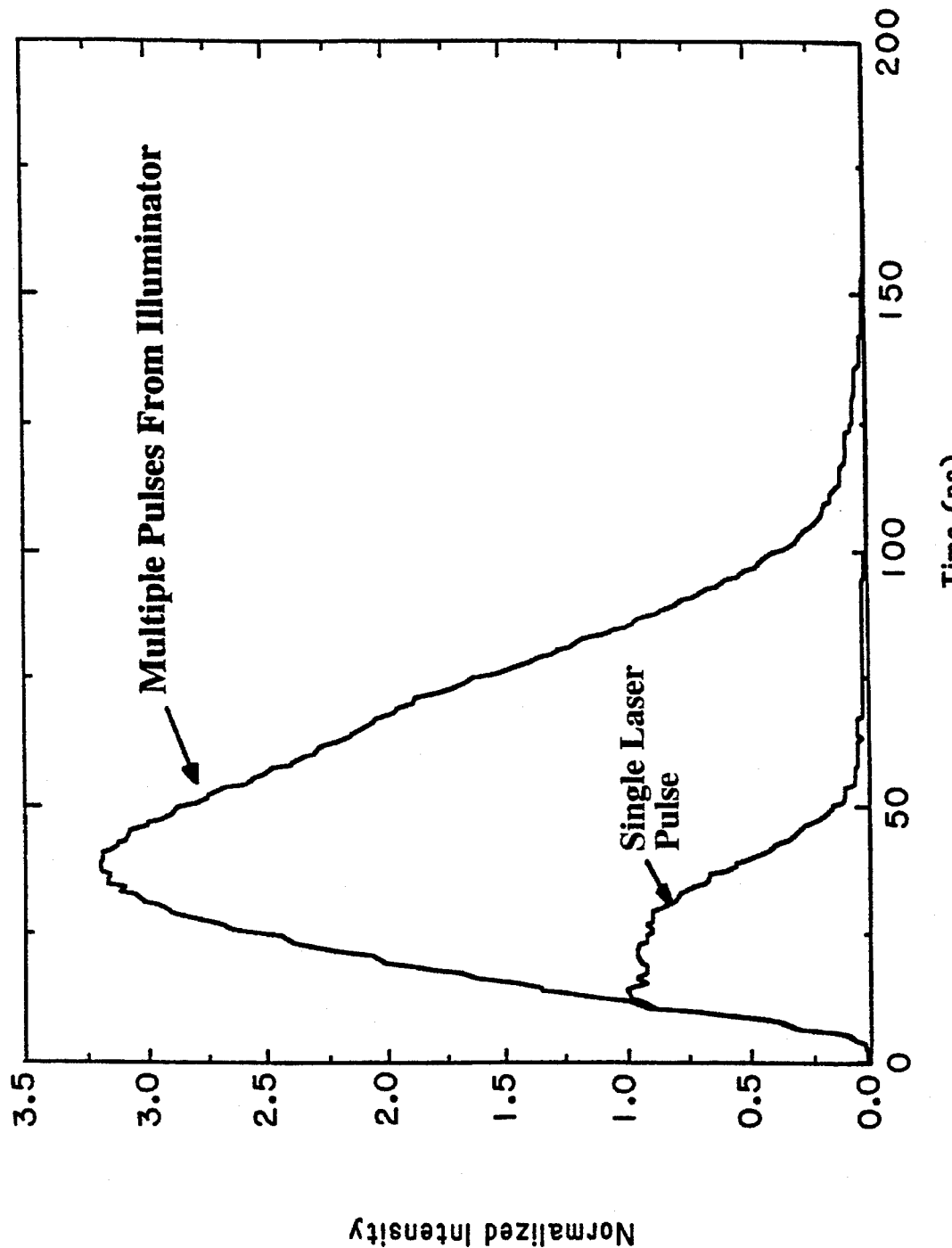
FIG. 7 illustrates the emission pulse duration produced by a short illuminator in accordance with the present invention.

In comparison to the time stretched pulse characteristic of the long illuminator of FIG. 6, attention is now directed to FIG. 7 showing the same effect, but for a relatively short illuminator, namely approximately 3 feet long. Here again the single laser pulse of FIG. 5 is reproduced. With the 3 foot length of the respective portion of the optical path, the delay time between successive arrivals of emission at the mask that was previously reflected from the mask is only approximately 6 ns. Since the peak width of a single laser pulse is on the order of 20 ns, the near peak intensity of a number of reflections will add, resulting in a much higher peak intensity than before, though with a substantially shorter time period. In that regard, it may be seen from FIG. 7 that the reflections of the individual laser pulses add to the extent of providing a peak amplitude of over 3 times that of an individual pulse, with a pulse shape approximating that of a somewhat slower, much higher amplitude, much higher energy single pulse rather than the multiple-peak waveform of FIG. 6.

The energy in the multiple pulse waveforms of FIGS. 6 and FIGS. 7 are substantially equal. However, since in general the illuminator length does not affect the reflectivity of the various surfaces or the number of reflections encountered between the delayed emission arrivals, the net effect of the illuminator length is not to control the energy of each pulse, but rather to control the effective waveform, in the case of a long illuminator of FIG. 6, to stretch the effective pulse in time at the expense of a more greatly increased peak energy, and in the case of the shorter illuminator of FIG. 7, to provide a much higher peak energy in a shorter pulse time. These two illuminator lengths are merely illustrative of two specific examples of the control over the pulse characteristics that the illuminator, more specifically the illuminator length, provides.

The ability to control the characteristics of the enhanced energy pulse is important, as different applications of lasers have different pulse requirements. By way of example, in the case of photo exposure such as used in photolithographic processes such as semiconductor manufacturing and the like, the photo sensitive materials are in general responsive to total energy, not peak intensity of the illumination. Consequently to reduce peak intensities and thus reduce the stress on reflective surfaces, etc., a long illuminator would generally be desired. In that regard, note that while FIG. 6 represents an illuminator of a length of 10 feet, that length is the length of the optical path from the reflective side of the entrance of the light pipe to the reflective surface of the mask, and is not necessarily the physical size of the illuminator, as the optical path may be folded back on itself to shorten the physical size while maintaining the optical length as desired.

In the case of material removal by ablation for drilling holes in circuit boards, ink jet printer heads and the like, peak intensity is the important parameter, as the higher the peak, the faster the material removal and the less the work piece is heated by the emission. Lower intensities however, have lower percentages of the emission resulting in material removal and higher percentages resulting in heating, with emission intensity below some threshold effectively only resulting in heating of the work piece. Since higher material removal rates reduce job completion time, and heating is undesirable because of distortion of the work piece and holder, resulting in inaccuracies in the material removal pattern, it is highly desirable in such applications to provide a high peak intensity, with the leading and trailing edges of the near peak intensity regions being as sharp as possible. Thus, in these applications a pulse shape characteristic of a short illuminator as in FIG. 7 would be much preferred over the pulse shape of FIG. 6 characteristic of a long illuminator.

Figure 8:
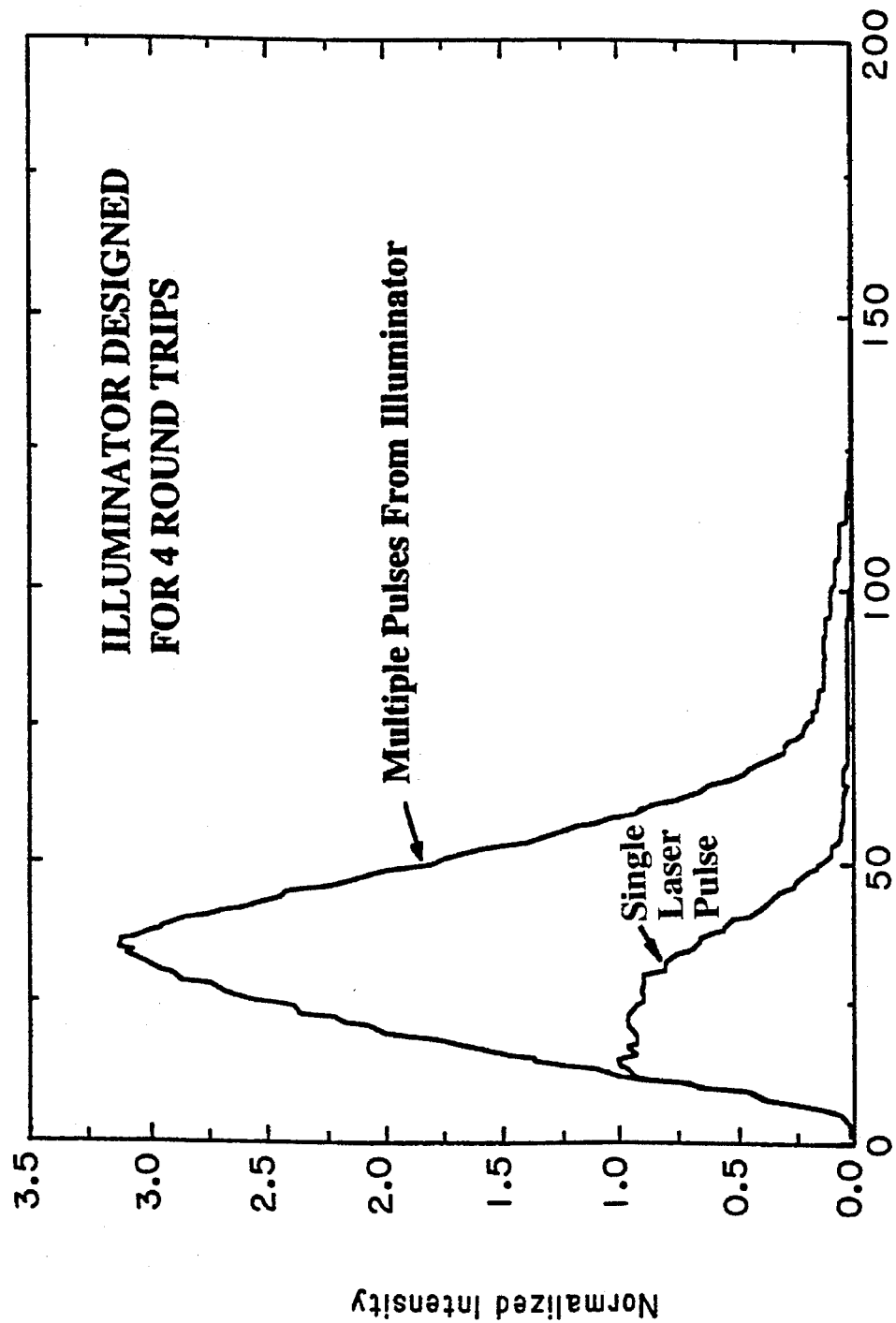
FIG. 8 illustrates the emission pulse duration produced by a terminated illuminator in accordance with the present invention.

Referring again to FIG. 7, the trailing edge of the illumination pulse shape of FIG. 7 is defined by the repeated summation of successively delayed and diminishing amplitude pulses. After a certain number of transits of the optical path, the illumination intensity has diminished to the point where the addition of further delayed pulses is merely contributing to the trailing edge of the pulse rather than to the peak or near peak intensity thereof. Accordingly, if the number of delayed pulses to be added could be specifically limited, the peak intensity obtained would not be significantly changed, but the fall time of the trailing edge of the pulse could be substantially shortened. This is illustrated in FIG. 8, wherein for the single laser pulse, the combined pulse represents the summation of the single pulse and three time delayed pulses, again with a short 3 foot illuminator as in FIG. 7. It may be seen from FIG. 8 that the capability of specifically limiting the number of round trips all re-reflections of emission reflected by the mask can undergo results in a pulse of substantially the same amplitude as that of FIG. 7, but with a substantially shorter fall time or trailing edge than that of FIG. 7.

Figure 9:
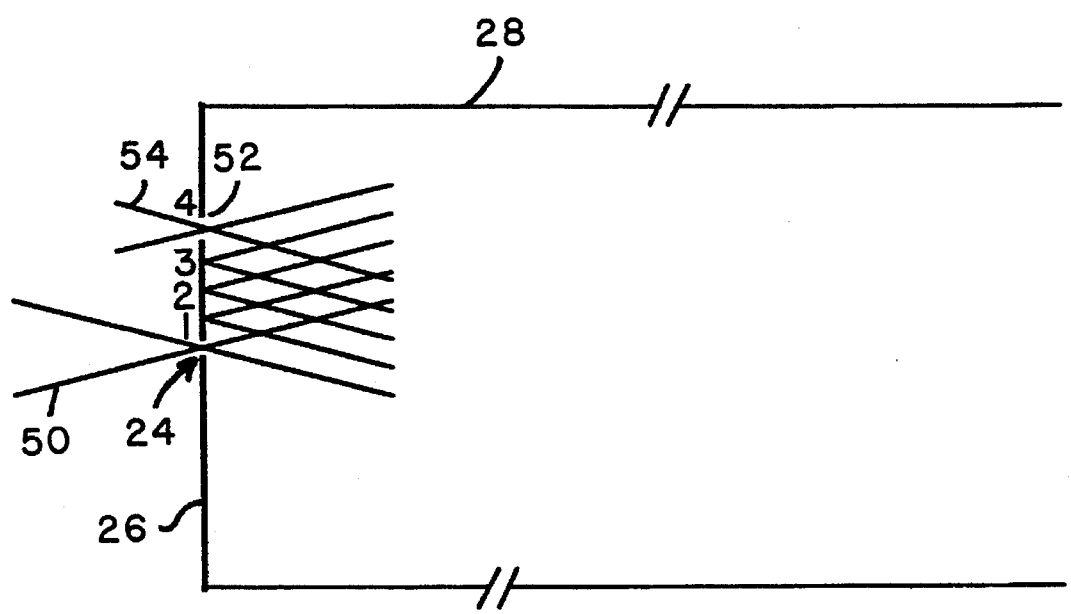
FIG. 9 illustrates a modification of the system of FIG. 1 to obtain the limited number of reflections as shown in FIG. 8.

The limited number of reflections as shown in FIG. 8 may be achieved by modifying the system of FIG. 1 in a manner illustrated in FIG. 9. In particular, if the optical system in FIG. 1 is near perfect, the omission reflected by the reflective surface of the mask would be refocused in the opening in the entrance end of the light pipe to return to the laser. On the other hand, if the detuning of the optical system is accomplished by slightly angling the telecentric lens 32 and the mask 34 (too small to illustrate), the primary effect would be to take the portion of the illumination reflected by the mask which would have been retroreflective and offset the same somewhat so that as shown in FIG. 9, the reflected portion of the incident illumination 50 is substantially focused at a position offset from the opening 24 in reflective member 26. Each subsequent reflection is still further offset, so that after the fourth round trip of the illumination in the nearly retroreflective system, the illumination now aligns with an additional opening 52 in the end 26 of the light pipe 28. Thus, after the fourth round trip, the emission 54 passes out of the optical system to be harmlessly dissipated. In this regard, if desired, the emission 54 passing out of the light pipe might be reflected to a direction approximately perpendicular to the axis of the optical system and spread over a large enough area of an absorbing surface to harmlessly terminate the same.

In FIG. 9, the successively reflected rays are labeled as 1, 2, 3 and 4, each shown schematically as being equally offset from each other and from the primary illumination 50. This is schematic only, in that it would be expected that the spacing between successive reflected rays would increase so that, by way of example, the distance between the third and fourth set of rays would be larger than the distance between the primary illumination 50 and the first reflection thereof. Further, while the degree of focus of the primary rays is relatively good, limited perhaps to that allowable without breakdown of air in the region, the degree of focus would be expected to decrease on each round trip of the illumination. Accordingly, the opening 52 for the rays 54 which are to pass out of the optical system may preferably be larger than the opening through which the initial illumination 50 passed. In that regard, note that in FIG. 9 the region above opening 52 in end 26 of the light pipe does not participate in the reflecting of the illumination of any of the first four round trips, so that the entire top of the light pipe end in the schematic of FIG. 9 can be left open if desired. Also, in this example, even if because of the defocusing and/or other effects, part of the illumination on say the fourth round trip is reflected and part passes out of the optical system, the part reflected in general will pass out of the system in the next round trip, so that the objective of cutting off the tail of the illumination seen by the mask and work piece is still achieved.

Now referring to FIG. 10, a further modification of the system of FIG. 1 to obtain split field illumination enhancement may be seen. Here the emission exiting the light pipe 28 is split and redirected by prism 50 to mirrors 52a and 52b, which further redirect the light along two spaced apart, parallel optical axes to reticle 34. Lenses 30a, 30b, 32a and 32b perform the same function as lenses 30 and 32 in FIG. 1, providing telecentric imaging of the emission onto the reticle, but this time with the emission being concentrated in and substantially equally distributed over two, spaced apart regions rather than one contiguous region. Such an arrangement would be highly useful for such purposes as forming a plurality of holes by ablation wherein the holes are arranged in separated areas such as in two parallel rows. Such an arrangement is often found in the electronics industry wherein lead connections for integrated circuits are often arranged in parallel rows, particularly in multi-chip module packaging.

Other common packaging arrangements used in the electronics industry have lead connections arranged in square and rectangular layouts. In such cases, a pyramid and four mirrors may be used in place of the prism 50 and associated mirrors to concentrate the emission in and substantially equally distributed over the four regions overlaying the hole pattern rather than one contiguous region. Obviously still other devices and shapes may be used to configure the emission into multiple areas, contiguous or not.

While the present invention has been disclosed and described with respect to certain preferred embodiments thereof, it will be understood by those skilled in the art that the present invention may be varied without departing from the spirit and scope thereof.

I claim:

1. A mask illumination system for use with a mask having a part thereof which is transmissive to define a desired pattern and which is otherwise reflective comprising:

a laser for providing laser emission;

first lens means for focusing the laser emission;

a plate having a reflective face and a first transmissive area therein, the plate being positioned substantially perpendicular to an axis of the laser emission approximately at a position of focus of the emission so that the emission projects through the first transmissive area in the plate;

a light pipe having an exit end, and having an entrance end positioned adjacent to the plate so as to receive the emission passing through the first transmissive area in the plate, the light pipe having reflective inner walls;

a mask having reflective portions and transmissive portions;

a telecentric field lens positioned to receive the laser emission which has passed through the light pipe and to direct the same substantially perpendicular to the mask;

the laser emission striking reflective portions of the mask being reflected back to the plate to miss the first transmissive area in the plate and be re-reflected by the reflective face back to the mask at different positions, thereby making available for potential use part of the laser emission not previously passing through the transmissive portions of the mask, the telecentric field lens guiding the reflected laser emission from the mask to the light pipe.

2. The mask illumination system of claim 1 wherein the telecentric field lens will receive the laser emission which has passed through the first transmissive area in the plate without reflection off the inner walls of the light pipe to direct the same substantially perpendicular to the mask, and will receive the laser emission which has passed through the first transmissive area in the plate and reflected at least once off the inner walls of the light pipe to direct the same to the mask.

3. The mask illumination system of claim 2 further comprised of lens means between the exit end of the light pipe and the telecentric field lens for imaging the exit end of the light pipe onto the telecentric field lens.

4. The mask illumination system of claim 2 for forming holes having a predetermined taper in work pieces by ablative material removal wherein the light pipe, the first lens means and the telecentric field lens of the illumination system are chosen to provide a predetermined taper in the laser emission that will pass through the transmissive portions of the mask.

5. The mask illumination system of any one of claims 2, 3 or 4 wherein the first lens means, and the light pipe are chosen to provide emission from the exit end of the light pipe comprising primarily emission that has passed through the light pipe without impinging on inner walls of the light pipe and emission which has passed through the light pipe with a single reflection from one of the inner walls of the light pipe.

6. The mask illumination system of any of claims 1, 2, 3 or 4 wherein the first transmissive area in the plate comprises a hole in the plate.

7. The mask illumination system of claim 1 further comprised of means for redirecting the emission to impinge on multiple areas of the mask.

8. The mask illumination system of claim 1 wherein the plate has a second transmissive area therein offset from the first transmissive area and positioned to allow reflected emission to pass therethrough after multiple rereflections thereof from and back to the mask.

9. A mask illumination system for use with a mask having a part thereof which is transmissive to define a desired pattern for ablative removal of material to form holes in a workplace which a have a predetermined taper, and which mask is otherwise reflective, comprising:

a laser for providing laser emission;

first lens means for focusing the laser emission from the laser;

a plate having a reflective face and a first transmissive area therein, a plane of the plate being substantially perpendicular to an axis of the laser emission approximately at a position of focus of the laser emission so that the laser emission projects through the first transmissive area in the plate;

a light pipe having an exit end, and having an entrance end positioned adjacent to the plate so as to receive the laser emission passing through the first transmissive area in the plate, the light pipe having reflective inner walls;

the first lens means and the light pipe being chosen to provide emission from the exit end of the light pipe having components of emission that have passed through the light pipe without impinging on the walls of the light pipe and components of emission which have passed through the light pipe with at least one reflection from the walls of the light pipe;

a mask having reflective portions and transmissive portions;

a telecentric field lens positioned to receive the laser emission which has passed through the first transmissive area in the plate without reflection off the inner walls of the light pipe to direct the same substantially perpendicular to the mask, and to receive the laser emission which has passed through the first transmissive area in the plate and reflected at least once off the inner walls of the light pipe and to direct the same to the mask, the telecentric field lens guiding the reflected laser emission from the mask to the light pipe;

the laser emission striking reflective portions of a mask being reflected back to the plate in a manner to miss the first transmissive area in the plate and be re-reflected by the reflective face back to the mask at different positions, thereby making available for potential use part of the laser emission not previously passing through the transmissive areas of the mask;

the light pipe, the first lens means and the telecentric field lens of the illumination system being chosen to provide a predetermined taper in the laser emission that will pass through the transmissive portions of the mask.

10. The mask illumination system of claim 9 further comprised of lens means between the exit end of the light pipe and the telecentric field lens for imaging the exit end of the light pipe onto the telecentric field lens.

11. The mask illumination system of claim 9 wherein the first lens means and the light pipe are chosen to provide emission from the exit end of the light pipe primarily having components of emission that have passed through the light pipe without impinging on the inner walls of the light pipe and components of emission which have passed through the light pipe with one reflection from the inner walls of the light pipe.

12. The mask illumination system of claim 9 further comprised of means for redirecting the emission to impinge on multiple areas of the mask.

13. The mask illumination system of claim 9 wherein the plate has a second transmissive area therein offset from the first transmissive area and positioned to allow reflected emission to pass therethrough after multiple rereflections thereof from and back to the mask.

14. A method of increasing the intensity of laser emission on a mask having a transmissive portion which defines a desired pattern and which is otherwise reflective comprising the steps of:

(a) providing an optical system having;
  (i) a source of laser emission;
  (ii) a light pipe having reflective inner walls and a plate at an entrance end of the light pipe, the plate having a reflective face and a first transmissive area therein and otherwise being reflective on a side thereof facing the light pipe; and,
  (iii) a telecentric field lens;

(b) focusing the laser emission through the transmissive area of the plate to illuminate an area of the telecentric field lens at least corresponding to an area of a mask to be illuminated, the telecentric field lens being positioned to receive the laser emission which has passed through the first transmissive area in the plate without reflection off the inner walls of the light pipe and to direct the same substantially perpendicular to the mask, and to receive the laser emission which has passed through the first transmissive area in the plate and reflected at least once off the inner walls of the light pipe and to direct the same to the mask;

(c) the laser emission striking reflective portions of a mask being reflected back to the reflective plate in a manner to miss the first transmissive area in the plate and be re-reflected by the reflective face back to the mask at different positions, thereby making available for potential use part of the laser emission not previously passing through the transmissive portion of the mask, the telecentric field lens guiding the reflected laser emission from the mask to the light pipe.

15. The method of claim 14 further comprised of the step of redirecting the emission to impinge on multiple areas of the mask.

16. The method of claim 14 further comprised of the step of allowing reflected emission to pass through a second transmissive area of the plate after multiple rereflections thereof from and back to the mask.

17. An ablation system comprising:

a work piece;

a mask having a transmissive area which defines a desired pattern on the work piece and which is otherwise reflective;

a laser for providing laser emission;

first lens means for focusing the laser emission;

a plate having a reflective face and a first transmissive area therein, the plate being positioned substantially perpendicular to an axis of the laser emission approximately at a position focus of the emission so that the emission projects through the first transmissive area;

a light pipe having an exit end, and having an entrance end positioned adjacent to the plate so as to receive the emission passing through the first transmissive area in the plate, the light pipe having reflective inner walls;

a telecentric field lens positioned to receive the laser emission which has passed through the light pipe and to direct the same substantially perpendicular to the mask;

the laser emission striking reflective portions of the mask being reflected back to the plate in a manner to miss the first transmissive area in the plate and be re-reflected by the reflective face back to the mask at different positions, thereby making available for potential use part of the laser emission not previously passing through the transmissive area of the mask, the telecentric field lens guiding the reflected laser emission from the mask to the light pipe.

18. The mask illumination system of claim 17 wherein the telecentric field lens will receive the laser emission which has passed through the first transmissive area in the plate without reflection off the inner walls of the light pipe to direct the same substantially perpendicular to the mask, and will receive the laser emission which has passed through the first transmissive area in the plate and reflected at least once off the inner walls of the light pipe to direct the same to the mask.

19. The system of claim 18 further comprised of lens means between the exit end of the light pipe and the telecentric field lens for imaging the exit end of the light pipe onto the telecentric field lens.

20. The system of claim 18 for forming holes having a predetermined taper in work pieces by ablative material removal wherein the light pipe, the first lens means and the telecentric field lens means of ablation system are chosen to provide a predetermined taper in the laser emission that will pass through the transmissive area of the mask.

21. The system of any one of claims 18, 19 or 20 wherein the first lens means and the light pipe are chosen to provide emission from the exit end of the light pipe comprising primarily emission that has passed through the light pipe without impinging on the inner walls of the light pipe and emission which has passed through the light pipe with a single reflection from one of the inner walls of the light pipe.

22. The system of any of claims 17, 18, 19 or 20 wherein the first transmissive area in the plate comprises a hole in the plate.

23. The system of claim 17 further comprised of means for redirecting the emission to impinge on multiple areas of the mask.

24. The system of claim 17 wherein the plate has a second transmissive area therein offset from the first transmissive area and positioned to allow reflected emission to pass therethrough after multiple rereflections thereof from and back to the mask.

25. An ablation method comprising the steps of:

(a) providing a work piece;

(b) providing a mask having a transmissive area which definer a desired pattern on the work piece and which is otherwise reflective;

(c) providing an optical system having;

(i) a source of laser emission;

(ii) a light pipe having reflective inner walls and a plate at an entrance end of the light pipe, the plate having a reflective face and a first transmissive area therein and otherwise being reflective on a side thereof facing the light pipe; and, (iii) a telecentric field lens;

(d) focusing the laser emission through the transmissive area of the plate to illuminate an area of the telecentric field lens at least corresponding to area of the mask to be illuminated, the telecentric field lens being positioned to receive the laser emission which has passed through the first transmissive area in the plate without reflection off the inner walls of the light pipe and to direct the same substantially perpendicular to the mask, and to receive the laser emission which has passed through the first transmissive area in the plate and reflected at least once off the inner walls of the light pipe and to direct the same to the mask;

(e) the laser emission striking reflective portions of the mask being reflected back to the reflective plate in a manner to miss the transmissive area in the plate and be re-reflected by the reflective face back to the mask at different positions, thereby making available for potential use part of the laser emission not previously passing through the transmissive area of the mask, the telecentric field lens guiding the reflected laser emission from the mask to the light pipe.

26. The method of claim 25 further comprised of the step of redirecting the emission to impinge on multiple areas of a mask.

27. The method of claim 25 further comprised of the step of allowing reflected emission to pass through a second transmissive area of the plate after multiple rereflections thereof from and back to the mask.

* * * * *

UNITED STATES PATENT AND TRADEMARK OFFICE
CERTIFICATE OF CORRECTION

PATENT NO.    : 5,601,733
DATED         : February 11, 1997
INVENTOR(S)   : William N. Partlo It is certified that error appears in the above-identified patent and that said Letters Patent is hereby corrected as shown below:

<u>Column 14,</u>
Line 19, delete "definer" and insert -- defines --.

Signed and Sealed this

Twenty-first Day of May, 2002

Attest:

JAMES E. ROGAN
*Director of the United States Patent and Trademark Office*

*Attesting Officer*